United States Patent
Ebert et al.

(10) Patent No.: US 8,222,171 B2
(45) Date of Patent: Jul. 17, 2012

(54) METHOD FOR THE PRODUCTION OF A CERAMIC SUBSTRATE, AND A CERAMIC SUBSTRATE

(75) Inventors: Marco Ebert, Wetter (DE); Martin Henrich, Wetzlar (DE); Andreas Lauer, Kirchhain (DE); Gotthard Nauditt, Huttenberg (DE); Thorsten Scheibel, Bad Nauheim (DE); Roland Weiss, Huttenberg (DE)

(73) Assignee: Schunk Kohlenstofftechnik GmbH, Heuchelheim (DE)

( * ) Notice: Subject to any disclaimer, the term of this patent is extended or adjusted under 35 U.S.C. 154(b) by 498 days.

(21) Appl. No.: 12/373,332

(22) PCT Filed: Jul. 13, 2007

(86) PCT No.: PCT/EP2007/057241
§ 371 (c)(1),
(2), (4) Date: Jan. 12, 2009

(87) PCT Pub. No.: WO2008/006900
PCT Pub. Date: Jan. 17, 2008

(65) Prior Publication Data
US 2009/0305867 A1 Dec. 10, 2009

(30) Foreign Application Priority Data
Jul. 13, 2006 (DE) .......... 10 2006 032 636

(51) Int. Cl.
| | | |
|---|---|---|
| C04B 35/52 | (2006.01) |
| C04B 35/56 | (2006.01) |
| C04B 35/03 | (2006.01) |
| C04B 35/00 | (2006.01) |
| B32B 9/00 | (2006.01) |
| B32B 9/04 | (2006.01) |
| B32B 13/04 | (2006.01) |
| B32B 19/00 | (2006.01) |
| H01L 29/12 | (2006.01) |
| C01B 31/00 | (2006.01) |
| C01B 31/36 | (2006.01) |
| C01B 31/30 | (2006.01) |
| C01B 31/34 | (2006.01) |

(52) U.S. Cl. ............. 501/90; 501/88; 501/94; 501/95.1; 501/154; 428/408; 428/446; 428/620; 428/698; 264/29.4; 264/29.6; 423/345; 423/439; 423/440

(58) Field of Classification Search .................... 501/88, 501/90, 94, 95.1, 154; 428/408, 698, 446, 428/620; 264/29.4, 29.6; 423/345, 346, 423/439, 440
See application file for complete search history.

(56) References Cited

U.S. PATENT DOCUMENTS

| | | | |
|---|---|---|---|
| 4,598,007 A * | 7/1986 | Kourtides et al. ............. 428/116 |
| 2002/0151428 A1* | 10/2002 | Horiuchi et al. ................ 501/88 |
| 2005/0020431 A1* | 1/2005 | Tani ............................... 501/88 |

FOREIGN PATENT DOCUMENTS

| | | |
|---|---|---|
| EP | 1634860 | 3/2006 |
| WO | 2005049524 | 6/2005 |

* cited by examiner

*Primary Examiner* — David M Brunsman
*Assistant Examiner* — Kevin Johnson
(74) *Attorney, Agent, or Firm* — Dennison, Schultz & MacDonald

(57) ABSTRACT

A method for the production of a ceramic substrate for a semiconductor component, includes the steps of producing paper containing at least cellulose fibers, as well as a filler to be carbonized and/or SiC, pyrolyzing the produced paper, and siliconizing the pyrolyzed paper.

14 Claims, 1 Drawing Sheet

METHOD FOR THE PRODUCTION OF A CERAMIC SUBSTRATE, AND A CERAMIC SUBSTRATE

The invention relates to a method for the production of a carbide ceramic substrate of a semiconductor component. Further, the invention refers to a ceramic substrate as a support for a semiconductor component.

In semiconductor technology, such as solar technology, it is known to apply electrically active layers to a substrate such as a graphite substrate. For solar cells, suitable supports typically have dimensions of a maximum of 10×10 cm, so that costly connection of suitable solar cells to panels is necessary.

The German Unexamined Patent Application No. DE-A-10 2004 043 985 discloses a carbide ceramic material and a method for producing the same. The carbide ceramic material has short carbon fibers as the starting material. The carbide ceramic material in this case can be used as a support structure for a silicon wafer or a lens support.

It is reported in citation DE.Z.: cfi/Ber. DKG 82 (2005), No. 5, D 32 that paper, which is loaded with fillers consisting of silicon and aluminum metal powder, is converted by pyrolysis and subsequent oxidation into SiC fiber ceramic bodies. In this case, the body has an internal skeleton of SiC and an outer layer of oxide ceramics. Patent Publication No. WO-A-2005/049524 discloses corresponding teaching.

Patent Publication No. EP-A-1 129 578 discloses a Si/SiC composite, which has cellulose fibers such as paper pulp as the major components. For the production of reactor tubes or wafer boats, cellulose fibers having a thickness of 20 μm and a length of 3 mm can be impregnated with a resin, to be then molded, pyrolyzed, and siliconized.

The present invention has as its object the provision of a ceramic substrate and a method for producing a ceramic substrate for a semiconductor component, which is made with a large area and is low in weight. At the same time, the ceramic substrate is to make possible the facilitation of the construction of active layers to be applied to the ceramic substrate and thereby to result in a cost reduction.

According to the method, the object is substantially achieved by the process steps:

Production of a paper containing at least cellulose fibers, as well as a filler to be carbonized, and/or SiC,
Pyrolysis of the produced paper, and
Siliconizing of the pyrolyzed paper.

According to the invention, paper loaded with carbonized filler such as carbon black is used, so that large-area ceramic substrates can be produced. Dimensions up to 1×1 m or greater are easily possible. At the same time, the ceramic substrate can be made extremely thin, so that the semiconductor component has a low weight. In addition to carbon black and/or at least one other carbonized or carbonizable filler, SiC or Si+SiC can be present. It is also possible to load the paper solely with SiC or SiC+Si. In addition, the paper to be pyrolyzed may contain a binder such as phenolic resin or cellulose. Regardless of this, the percentage by weight of the filler should be 50% by weight to 85% by weight based on the paper dry matter consisting of paper cellulose fibers and filler.

The siliconizing itself should occur with the use of high-purity silicon; here, the process may be performed with an excess or deficient amount. The siliconizing may be carried out thereby using conventional methods. In particular, however, for siliconizing the pyrolyzed paper is brought into contact with a silicon melt, e.g., by wicking, transfer plates, or similar techniques.

In an emphasized embodiment of the invention, as mentioned, it is siliconized with silicon in an excess amount, whereby a silicon layer forms on at least one flat side of the siliconized ceramic substrate, on which the active layers of the semiconductor component are then applied in particular epitaxially, e.g., by CVD.

The pyrolyzed paper is siliconized in a reaction chamber preferably at a pressure, which is to be within the range of 50 mbar to 0.05 mbar, particularly within the range of 0.1 mbar. After the reaction of C with Si to form SiC, the reaction chamber is then aerated with an inert gas atmosphere, so that excess silicon is not removed from the reaction chamber, but can form as a Si layer on the siliconized ceramic substrate. In so doing, the process should be controlled preferably in such a way that the Si layer has a thickness d of $0.5\,\mu m \leq d \leq 50\,\mu m$, particularly $10\,\mu m \leq d \leq 20\,\mu m$. Next, the Si layer should be melted just above of the melting point of silicon and then recrystallized, to find a nucleation layer to be used for the semiconductor component active layers to be applied epitaxially, therefore particularly Si layers with a desired doping.

The siliconizing itself should be carried out at a temperature T of $1350°\,C. \leq T \leq 2000°\,C.$, particularly within the range of $1650°\,C. \leq T \leq 1700°\,C.$ A support of a semiconductor component in the form of a ceramic substrate is notable in that the ceramic substrate is a paper, converted to SiC and loaded with a carbonizable filler and/or SiC, and in particular on at least one flat side of the ceramic substrate there is a recrystallized Si layer, which is formed during the production of the ceramic substrate.

The base for the support accordingly is a ceramic paper.

The SiC ceramic substrate itself should have a thickness D of $D \leq 2$ mm, preferably $D \leq 0.8$ mm. Preferably, the thickness D is $0.5$ mm $\leq D \leq 1$ mm.

The Si layer applied to at least one side of the ceramic substrate has a thickness d of $0.5\,\mu m \leq d \leq 50\,\mu m$, particularly $10\,\mu m \leq d \leq 20\,\mu m$.

The area F of the ceramic substrate should be in particular $1600\,cm^2 \leq F \leq 10,000\,cm^2$ or more.

The percentage by volume V of SiC in the paper itself is preferably 25% by volume $\leq V \leq$ 85% by volume, particularly 60% by volume $\leq V \leq$ 80% by volume.

The invention is notable, furthermore, for the use of a cellulose-containing paper, filled with a filler reacting to form SiC and/or with SiC, for the production of a carbide ceramic as a substrate for a semiconductor component. In this case, it is provided in particular that the proportion G of the filler is 50% by weight $\leq G \leq$ 85% by weight, based on the paper dry matter consisting of cellulose fibers and filler.

The filler, which is preferably carbon black or contains carbon black, may contain in addition or alternatively SiC and Si in the necessary stoichiometric ratio.

In addition to the filler, other additives such as binders may be added to the paper.

Other details, advantages, and features of the invention emerge not only from the claims, the features to be derived therefrom, alone and/or in combination, but also from the following description of exemplary embodiments and graphic drawings.

EXAMPLE 1

A paper web with a thickness of 0.7 mm, a weight of about 800 g/m$^2$, and an area of 1 m$^2$ is used, which is loaded with a filler consisting of carbon black. The percentage by weight of the filler is about 75% based on paper dry matter consisting of cellulose fibers and filler. The thus loaded paper is then carbonized in an inert atmosphere at a temperature between 800° C. and 1400° C. Thereafter, siliconizing of the carbonized paper occurs by means of a wick with a silicon melt, at a temperature in the range between 1650° C. and 1700° C. A pressure in the range of 0.1 mbar prevails within the reaction chamber itself. The siliconizing occurs here with an excess of silicon. After the reaction of silicon with carbon to form SiC is completed, the reaction chamber is aerated with an inert gas to avoid removal of excess silicon. In this way, a Si layer forms on the ceramic substrate, the process being controlled in such a way that the thickness is within the range between 10 µm and 20 µm. The solidified layer is then melted again at a temperature just above of the melting point of silicon and recrystallized. High-purity silicon is used for the siliconizing itself.

A thin-walled, highly stable structure results. Micrographs show that the substrate consists substantially of SiC surrounding free silicon. Unreacted C may be present to an insignificant degree.

The ceramic may be used as a substrate for a solar cell. In this case, the electrically active layers of the solar cell are applied epitaxially to the recrystallized Si layer using a conventional technique such as CVD. The recrystallized Si layer has the function of a nucleation layer.

EXAMPLE 2

A paper web with a thickness d of 0.7 mm, a weight of about 900 g/m$^2$, and an area of 1 m$^2$ is used, which is loaded with a filler consisting of carbon black and SiC. The percentage by weight of the filler is about 75% based on paper dry matter consisting of cellulose fibers and filler. The thus loaded paper is then carbonized in an inert atmosphere at a temperature between 800° C. and 1400° C. Thereafter, siliconizing of the carbonized paper occurs by means of a wick with a silicon melt, at a temperature in the range between 1650° C. and 1700° C. A pressure in the range of 0.1 mbar prevails within the reaction chamber itself. The siliconizing occurs here with an excess of silicon. After the reaction of silicon with carbon to form SiC is completed, the reaction chamber is aerated with an inert gas to avoid removal of excess silicon. In this way, a Si layer forms on the ceramic substrate, the process being controlled in such a way that the thickness is within the range between 10 µm and 20 µm. The solidified layer is then melted again at a temperature just above of the melting point of silicon and recrystallized. High-purity silicon is used for the siliconizing itself.

A thin-walled, highly stable structure results. Micrographs show that the substrate consists substantially of SiC surrounding free silicon. Unreacted C may be present to an insignificant degree.

The ceramic may be used as a substrate for a solar cell. In this case, the electrically active layers of the solar cell are applied epitaxially to the recrystallized Si layer using a conventional technique such as CVD. The recrystallized Si layer has the function of a nucleation layer.

EXAMPLE 3

A paper web with a thickness d of 0.7 mm, a weight of about 900 g/m$^2$, and an area of 1 m$^2$ is used, which is loaded with a filler consisting of carbon black and SiC. The percentage by weight of the filler is about 75% based on paper dry matter consisting of cellulose fibers and filler. The thus loaded paper is then carbonized in an inert atmosphere at a temperature between 800° C. and 1400° C. Thereafter, siliconizing of the carbonized paper occurs by means of a wick with a silicon melt, at a temperature in the range between 1650° C. and 1700° C. A pressure in the range of 0.1 mbar prevails within the reaction chamber itself. The siliconizing occurs with a deficient amount of silicon, to produce a ceramic component which has a lower weight because of the remaining residual carbon or residual porosity. After capillary siliconizing has occurred, the remaining Si vapor pressure is used in the siliconizing plant to deposit Si from the vapor phase on the substrate surface. Then, inertgas is used for aeration, the process being controlled in such a way that the thickness of the Si layer is within the range of 10 µm to 20 µm. The solidified layer is then melted again at a temperature just above of the melting point of silicon and recrystallized. High-purity silicon is used for the siliconizing itself.

A thin-walled, highly stable structure results. Micrographs show that the substrate consists substantially of SiC surrounding free silicon. Unreacted C may be present to an insignificant degree.

The ceramic may be used as a substrate for a solar cell. In this case, the electrically active layers of the solar cell are applied epitaxially to the recrystallized Si layer using a conventional technique such as CVD. The recrystallized Si layer has the function of a nucleation layer.

Figure 1:
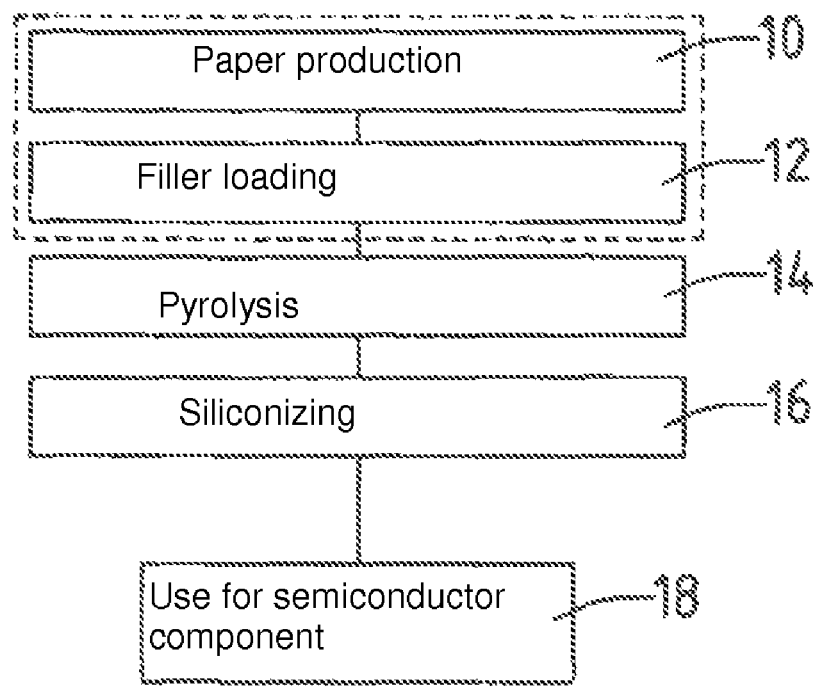
FIG. 1 depicts a flowchart of the method of the invention for producing a ceramic substrate of a semiconductor component.

The method of the invention will be explained again with use of FIG. 1. In order to produce a ceramic substrate for a semiconductor component, which is made with a large area and has a low weight, the paper is made first and loaded with fillers such as carbon black and SiC. In this case, the paper production and filler loading may occur in one procedure, as indicated by the broken line surrounding the process steps paper production 10 and filler loading 12. Next, the filler-loaded paper is pyrolyzed, and carbonization occurs at a temperature preferably in the range between 800° C. and 1400° C. (process step 14). Then siliconizing occurs (process step 16). This may occur by means of a wick with a silicon melt at a temperature in the range between 1650° C. and 1700° C. in a reaction chamber, in which a pressure of 0.1 mbar prevails. The siliconizing should occur in this case with a silicon excess. In this case, after the reaction of silicon with carbon to form SiC is completed, the reaction chamber is aerated with an inert gas to avoid removal of excess silicon. This achieves that a Si layer forms on the ceramic substrate thus produced, thicknesses between 10 µm and 20 µm being achieved depending on the process control. A corresponding ceramic substrate having a silicon layer may then be used as a support for a semiconductor component (process step 18). A solar cell, which can be derived purely in principle from FIG. 2, is provided in particular as the semiconductor component.

Solar cell 20 has a support or a substrate 22 in the form of the ceramic produced as taught by the invention; here, the surface facing the photoactive layers has a Si layer 24 in the range between 10 µm and 20 µm. The thickness of support 22 is such that the cell is stable in its form.

Silicon layer 24 may act as a nucleation layer, to which is applied epitaxially, e.g., a p-conducting SiC layer 26 with a thickness in the range between 20 µm and 100 µm, which acts as a back contact. The photoactive epitaxial layers 28, 30 in the form of a p-conducting layer and in the form of an n-conducting layer are then applied to SiC layer 26. Finally, preferably strip-shaped front contacts 32, 34, 36 are applied to the n-conducting layer 30.

Figure 2:
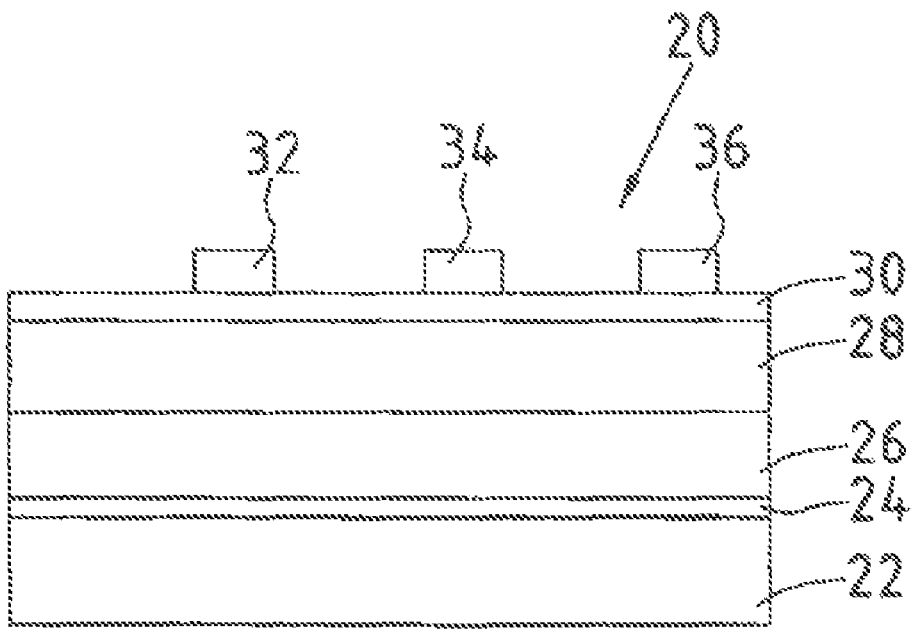
FIG. 2 is a cross-section of a solar cell incorporating the ceramic substrate produced by the method of the invention.

Solar cell 20 shown in FIG. 2 is to be understood purely in principle in terms of its structure, and a pn structure may also be present instead of an np structure.

Based on the teaching of the invention, large-area solar cells of sufficient stability may be produced, which have areas 1 m² or more in size.

The invention claimed is:

1. A method for the production of a ceramic substrate of a semiconductor component, said method comprising the steps of:
    producing a paper containing at least cellulose fibers, a filler,
    wherein the percentage by weight G of the filler is 50% by weight≦G≦85% by weight, based on the paper dry matter consisting of cellulose fibers and filler,
    wherein carbon black or a mixture of carbon black and SiC, or a mixture of carbon black, SiC, and Si, is used as filler,
    pyrolyzing the produced paper, and
    siliconizing the pyrolyzed paper.

2. The method according to claim 1, wherein a binder is added as an additive for the paper to be pyrolyzed.

3. The method according to claim 1, wherein the pyrolyzed paper is siliconized with high-purity silicon.

4. The method according to claim 1, wherein the pyrolyzed paper is siliconized with high-purity silicon in an excess or deficient amount.

5. The method according to claim 1, wherein the pyrolyzed paper is siliconized with a silicon melt.

6. The method according to claim 1, wherein excess silicon is formed as a silicon layer on at least one flat side of the siliconized ceramic substrate.

7. The method according to claim 6, wherein the formation of the Si layer is carried out in a reaction chamber before, during, or after aeration of the reaction chamber in an inert gas atmosphere.

8. The method according to claim 6, wherein after formation of the Si layer, said layer is melted and cooled for recrystallization.

9. The method according to claim 1, wherein the pyrolyzed paper is siliconized in a reaction chamber at a pressure p of 50 mbar≧p≧0.05 mbar.

10. The method according to claim 9, wherein the pyrolyzed paper is siliconized in the reaction chamber at a pressure p≈0.1 mbar.

11. The method according to claim 1, wherein a reaction of the pyrolzed paper with Si to SiC is carried out at a temperature T of 1350° C.≦T≦2000° C.

12. The method according to claim 11, wherein the reaction is carried out at a temperature T of 1650° C.≦T≦1700° C.

13. The method according to claim 1, wherein the filler has a percentage by weight G of 60% by weight≦G≦80% by weight.

14. A method of using the substrate produced by the method according to claim 8, wherein epitaxial layers of the semiconductor component are applied to the recrystallized Si layer.

\* \* \* \* \*